United States Patent [19]

Baliga

[11] Patent Number: 4,937,644
[45] Date of Patent: Jun. 26, 1990

[54] ASYMMETRICAL FIELD CONTROLLED THYRISTOR

[75] Inventor: B. Jayant Baliga, Clifton Park, N.Y.

[73] Assignee: General Electric Company, Schenectady, N.Y.

[21] Appl. No.: 756,478

[22] Filed: Jul. 17, 1985

Related U.S. Application Data

[63] Continuation of Ser. No. 597,895, Apr. 9, 1984, abandoned, which is a continuation of Ser. No. 290,133, Aug. 5, 1981, abandoned, which is a continuation of Ser. No. 94,943, Nov. 16, 1979, abandoned.

[51] Int. Cl.$^5$ ............................................. H01L 29/74
[52] U.S. Cl. ........................................ 357/38; 357/22; 357/58; 357/89
[58] Field of Search .................... 357/22, 38, 58, 89

[56] References Cited

U.S. PATENT DOCUMENTS

| | | | |
|---|---|---|---|
| 3,409,812 | 11/1968 | Zuleeg | 357/22 E |
| 3,465,216 | 9/1969 | Teszner | 357/22 E |
| 3,482,151 | 12/1969 | Teszner et al. | 357/22 F |
| 3,497,777 | 2/1970 | Teszner | 357/22 E |
| 3,814,995 | 6/1974 | Teszner | 357/55 |
| 4,223,328 | 9/1980 | Terasawa et al. | 57/38 |

Primary Examiner—Joseph E. Clawson, Jr.
Attorney, Agent, or Firm—Marvin Snyder; James C. Davis, Jr.

[57] ABSTRACT

A field controlled thyristor having its base doped more lightly near the gate than near the anode achieves a low forward voltage drop, high blocking gain, and fast switching speed at any given forward blocking voltage rating. Although the high resistivity region around the gate area allows the device to pinch off anode current flow at zero gate bias due to the gate junction inherent potential, a small forward gate voltage can trigger the device into conduction. The high resistivity of the channel area between gates provides DC blocking gains greater than 60. The device can be fabricated using conventional planar processing techniques.

20 Claims, 3 Drawing Sheets

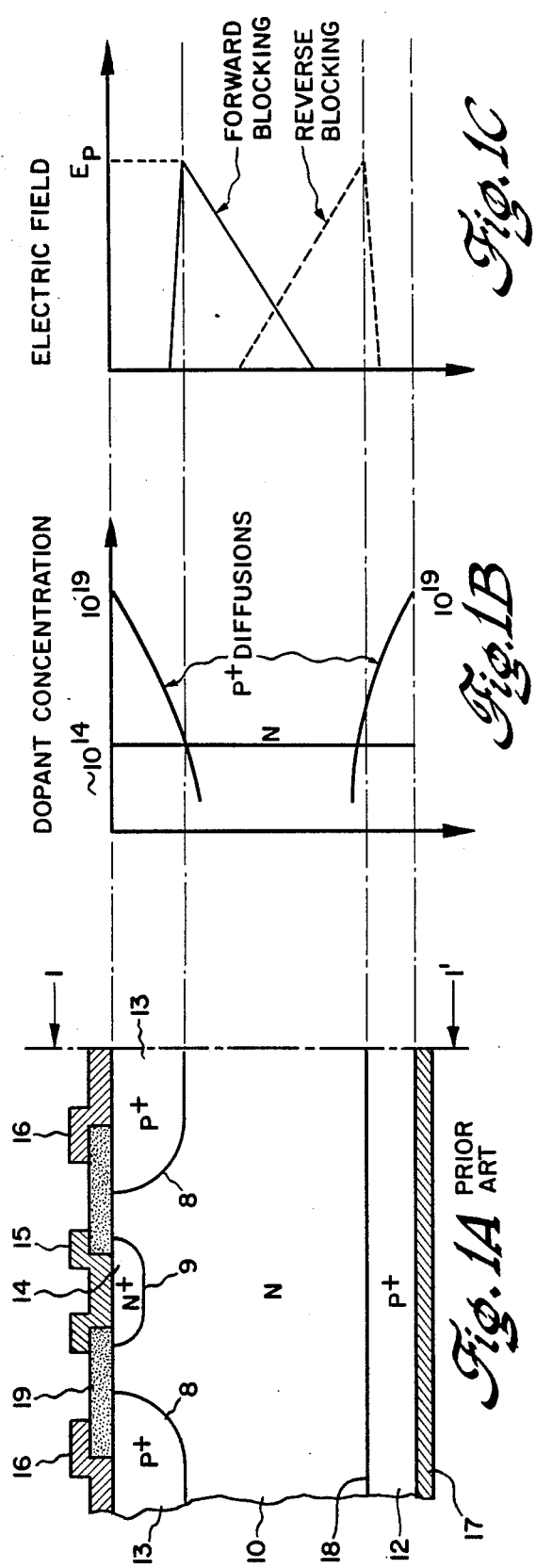
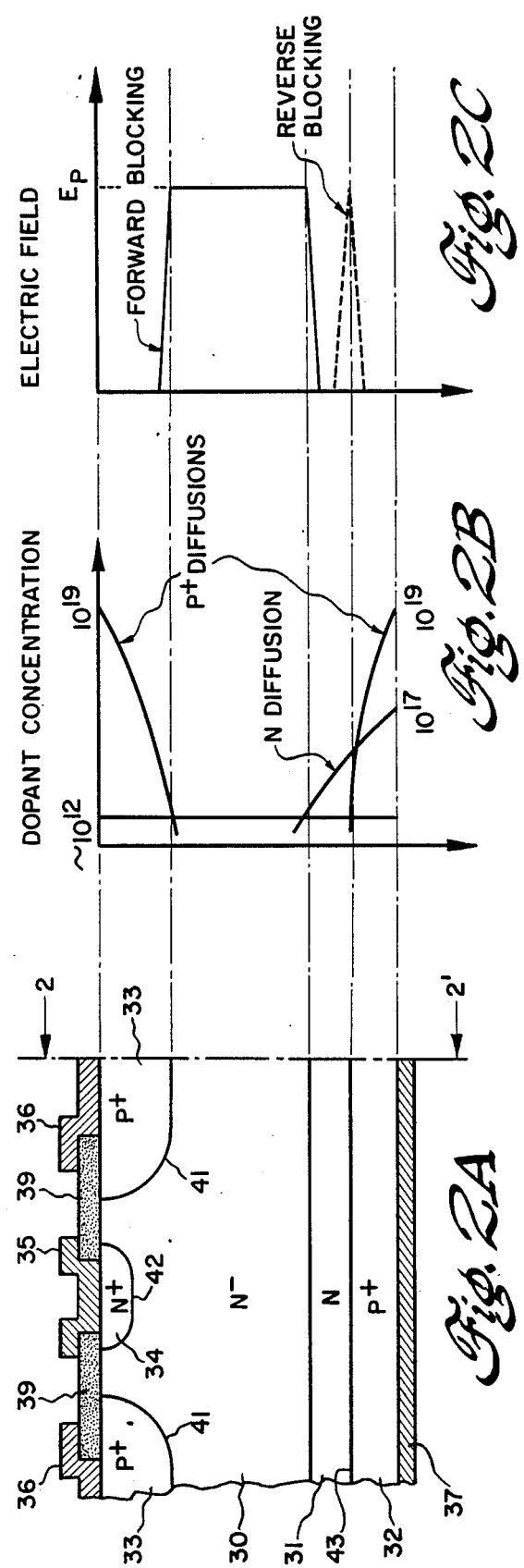

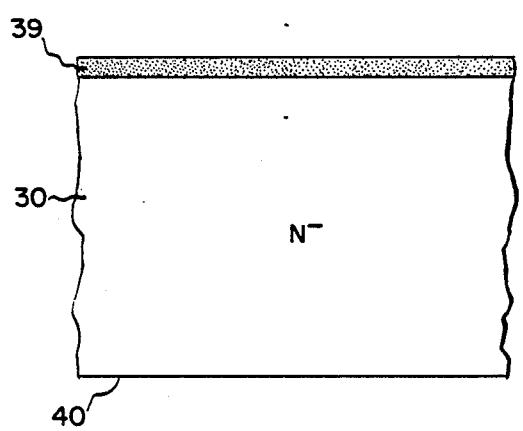
Fig. 3A
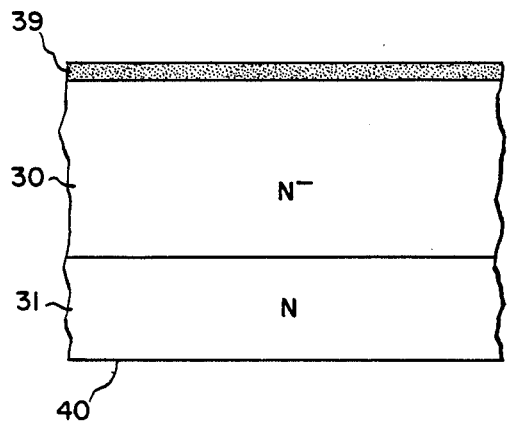
Fig. 3B
*Fig. 3C*
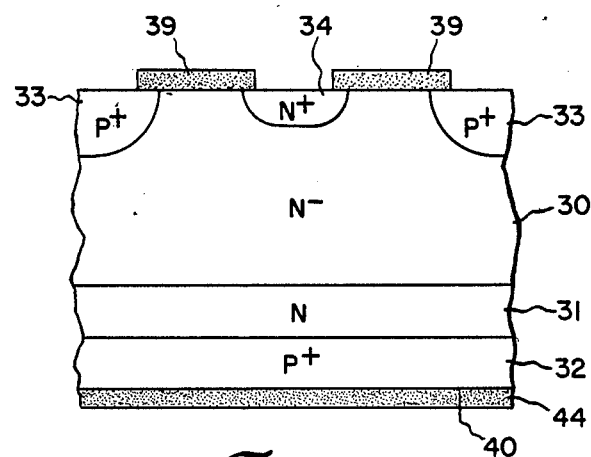
Fig. 3D
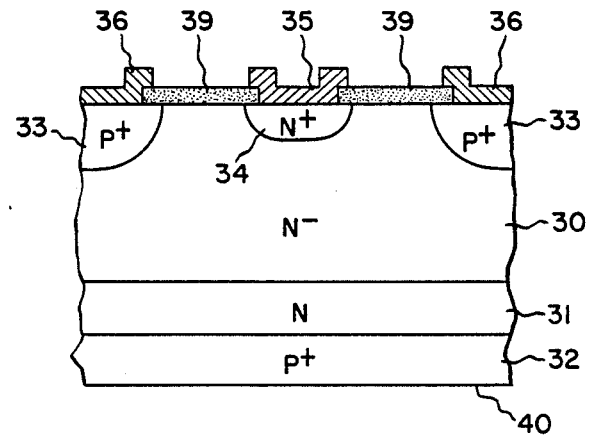
Fig. 3E
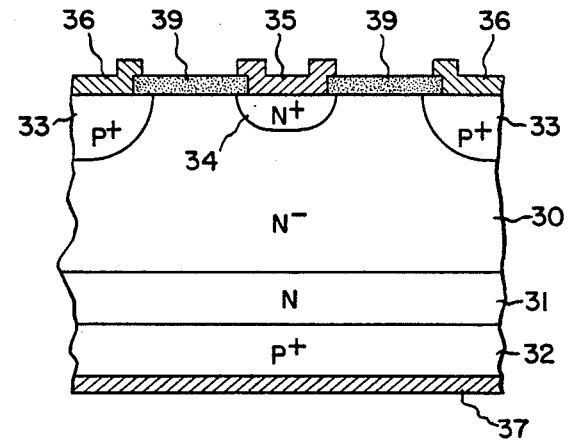
Fig. 3F

ASYMMETRICAL FIELD CONTROLLED THYRISTOR

This application is a continuation, of application Ser. No. 597,895, filed Apr. 9, 1984 which is a continuation of application Ser. No. 290,133, filed Aug. 5, 1981, which is a continuation of application Ser. No. 094,943, filed Nov. 16, 1979, all abandoned.

INTRODUCTION

This invention relates to power field effect semiconductor devices, and more particularly to field controlled thyristors in which the electric field distribution is patterned by employing a lightly doped N base region near the gate and cathode surfaces of the device, and a more heavily doped N base region near the anode surface of the device.

A field controlled thyristor typically comprises a P+ N N+ rectifier with the N base containing heavily doped P+ gate regions. The device is operated by maintaining the N+ cathode at ground potential while applying bias voltages on the anode and gate terminals. In absence of any applied potential on the gate regions, the device behaves as a conventional rectifier. Consequently, the device is capable of conducting large current with low forward voltage drop when a positive bias is applied to the anode terminal, and can block current flow when negative bias is applied to the anode terminal. The gate regions of a field controlled thyristor are designed to pinch off current flow between anode and cathode when the gate is biased negative with respect to the cathode. The gate regions, therefore, provide the device with a forward blocking capability similar to that of a conventional thyristor. Field controlled thyristors with good operating characteristics are those that can block large anode voltages with small gate voltages. Therefore, the ratio of anode voltage, at the onset of anode current flow, to applied gate voltage at that instant is an important parameter for these devices and is termed the blocking gain. This blocking gain is a strong function of the geometrical shape of the channel formed between the gate regions, and is also dependent on the N base resistivity. In addition to providing the device with forward blocking capability, the gate regions can also be used to extinguish anode current when the device is in its conductive state. If a reverse bias is applied to the gate when the device is conducting anode current, the gate depletion layer extends into the channel and pinches off the anode current. This gate voltage induced turn-off feature provides the field controlled thyristor with a high speed switching capability, making it applicable to higher frequencies than achievable with conventional thyristors.

Two basic types of field controlled thyristor gate structures are well known. These are the buried grid gate structure and the surface grid gate structure. The buried grid devices have been fabricated by diffusion of P+ grid fingers (or a mesh) into an N type substrate, followed by growth of an N type epitaxial layer over the diffused area. The buried grid structure has also been produced by ion-implantation of boron into an N type substrate. These devices exhibit moderate blocking gains (20-40) but have a limited gate turn-off capability due to the inherently high resistance of even heavily doped buried grid fingers which causes debiasing of the grid fingers during turn-off. This limitation has motivated development of surface gate devices with very low gate resistances achieved by contacting the gate fingers along their entire lengths with patterned metallization. Early surface gate devices of this type were fabricated by planar diffusion of boron into 60 ohm-cm N type substrates. Despite a diffusion depth of 10 micrometers, the cylindrical shape of the planar diffused gate regions resulted in an open channel structure which had a low blocking gain (5 to 7). To increase the blocking gain, an improved surface gate structure, with steep vertical gate walls, has been recently developed by using orientation dependent etching and selective vapor phase epitaxial growth in the etched grooves. With this device structure, blocking gains as high as 45 have been achieved at groove depths of about 40 micrometers. These devices have also exhibited very fast gate turn-off speeds. However, the fabrication process for these devices is complex and results in a low device yield.

By use of the present invention, a power field controlled thyristor with significant improvements in blocking gain, turn-off speed and on-state forward voltage drop can be achieved. This device structure, however, has a limited reverse blocking capability and hence is termed an asymmetrical field controlled thyristor. This reduced reverse blocking capability is not a serious disadvantage in many high frequency inverter applications where anti-parallel diodes are used. Although both surface and buried gate devices can be fabricated in the new configuration described herein, it is of particular importance to surface gate devices because very high blocking gains can be achieved with this structure, even though conventional planar processing is employed for device fabrication. This greatly simplifies fabrication of the device and results in a higher yield during fabrication in comparison with the earlier surface gate devices.

Accordingly, one object of the invention is to provide a field controlled thyristor with gate turn-off capability and high blocking gain.

Another object is to provide a power field controlled thyristor having low forward voltage drop and a high speed switching capability.

Another object is to provide an asymmetrical power field controlled thyristor which can be fabricated by use of conventional planar semiconductor diffusion technology.

Briefly, in accordance with a preferred embodiment of the invention, an asymmetrical field controlled thyristor comprises a semiconductor substrate of one type conductivity and a dual-layer base region adjoining the substrate and being comprised of an integral portion of the semiconductor material with a second type conductivity, the layer of the dual-layer base region closest to the substrate being doped at a higher concentration of the second conductivity type-determining dopants than the layer of the dual-layer base region farthest from the substrate. A cathode region adjoins the layer of the dual-layer base region farthest from the substrate and is comprised of the semiconducor material of the second type conductivity. The cathode region is doped at a higher concentration of the second conductivity type-determining dopants. A plurality of semiconductor gate regions are provided and are spaced apart from the cathode region on either side thereof. The gate regions adjoin the layer of the dual-layer base region farthest from the substrate and are comprised of the semiconductor material of the one type conductivity. First, second and third conductive means are provided for contacting the outermost surface of the cathode region, the gate regions, and the anode region, respectively.

In accordance with another preferred embodiment of the invention, a method of fabricating an asymmetrical field controlled thyristor comprises oxidizing a major surface of a semiconductor substrate of a first type conductivity having two major surfaces, and diffusing dopants into the unoxidized major surface of the substrate to form a more heavily doped layer in the semiconductor substrate than the remaining portion of the substrate, the more heavily doped layer being of the same type conductivity as that of the remaining portion of the substrate. The oxide layer is then patterned to open a gate diffusion area therein, and dopants are diffused into the substrate through both major surfaces so as to produce a plurality of gate regions of opposite type conductivity adjoining the remaining portion of the substrate and an anode region of the opposite type conductivity adjoining the more heavily doped layer in the substrate. The oxide layer is next patterned to open only a cathode diffusion area therein, and dopants are diffused into the substrate through the cathode diffusion area so as to provide a cathode region of the first type conductivity adjoining the remaining portion of the substrate. A layer of metal is then applied over the outermost surfaces of the cathode and gate regions, and is patterned to obtain separate contacts to the cathode regions and to the gate regions respectively. A layer of metal is also applied over the outermost surface of the anode region in order to make contact therewith.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 1A represents a sectional, schematic view of a conventional field controlled thyristor structure:

FIG. 1B is a graphical illustration of the doping profile for the device of FIG. 1A, with dopant concentration at section 1—1' in FIG. 1A plotted along the abscissa and depth beneath the uppermost surface of the device plotted along the ordinate:

FIG. 1C is a graphical representation of the electric field distribution in the device of FIG. 1A, with electric field strength at section 1—1' in FIG. 1A plotted along the abscissa and depth beneath the uppermost surface of the device plotted along the ordinate;

FIG. 2A represents a sectional, schematic view of the asymmetrical field controlled thyristor structure of the present invention;

FIG. 2B is a graphical illustration of the doping profile for the device of FIG. 2A, with dopant concentration at section 2—2' in FIG. 2A plotted along the abscissa and depth beneath the uppermost surface of the device plotted along the ordinate;

FIG. 2C is a graphical representation of the electric field distribution in the device of FIG. 2A, with electric field strength at section 2—2' in FIG. 2A plotted along the abscissa and depth beneath the uppermost surface of the device plotted along the ordinate;

FIG. 3A depicts an N type silicon wafer and oxide layer initially produced during the fabrication of the asymmetrical field controlled thyristor of the present invention;

FIG. 3B illustrates the structure of FIG. 3A after oxide removal and a phosphorus diffusion on the lowermost or back surface of the wafer;

FIG. 3C depicts the structure of FIG. 3B after fabrication of anode and gate regions;

FIG. 3D illustrates the structure of FIG. 3C subsequent creation of the source or cathode region;

FIG. 3E depicts the structure of FIG. 3D after fabrication of gate and cathode contacts; and FIG. 3F represents the completed asymmetrical field controlled thyristor structure of the present invention with an anode contact established on the underside of the wafer.

DESCRIPTION OF TYPICAL EMBODIMENTS

Figure 1D:
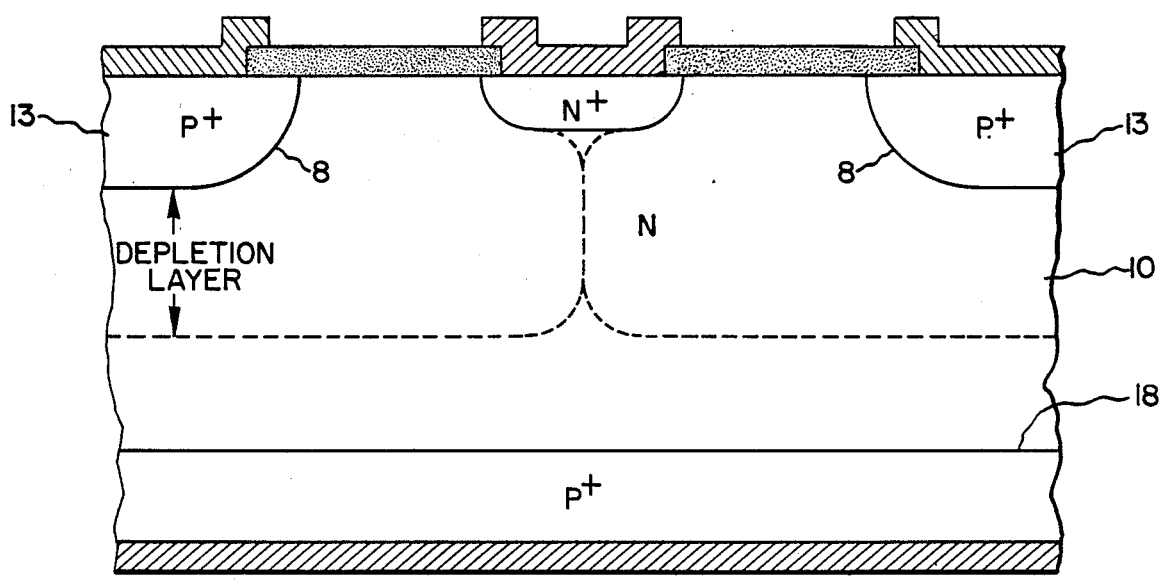
FIG. 1D illustrates the location of the depletion layer in the device of FIG. 1A.

In FIG. 1A, a conventional field controlled thhristor is illustrated as comprised of semiconductor material with an N type base region 10, a P+ anode region 12, P+ grid regions 13, and an N+ cathode region 14. N base region 10 forms gate interfaces 8 and a cathode interface 9 with gate regions 13 and cathode region 14, respectively, and forms an anode interface 18 with anode region 12. Cathode, grid and anode contacts 15, 16 and 17, respectively, are provided, typically in the form of aluminum metallization, with the remainder of the uppermost surface of the device passivated by silicon oxide layer 19.

In FIG. 2A, the asymmetrical field controlled thyristor of the instant invention is illustrated as comprised of semiconductor material with a dual-layer N type base including a lightly doped N— portion 30 and a more heavily doped N portion 31. The remainder of the structure is similar to that of FIG. 1A in that it includes a P+ anode region 32, P+ grid regions 33, and an N+ cathode region 34. N— base layer 30 forms gate interfaces 41 and a cathode interface 42 with gate regions 33 and cathode region 34, respectively, and N+ base layer 31 forms an anode interface 43 with anode region 32. Cathode, grid and anode contacts 35, 36 and 37, respectively, are provided, typically in the form of aluminum metallization, and the remainder of the uppermost surface of the device is passivated by silicon oxide layer 39.

Associated with the devices of FIGS. 2A and 1A are the doping profiles of the respective devices, shown in FIGS. 2B and 1B, respectively, and the electric field distribution in the respective devices during both forward blocking and reverse blocking, as shown in FIGS. 2C and 1C, respectively. The field controlled thyristor of the present invention, shown in FIG. 2A, should be contrasted with the conventional device structure shown in FIG. 1A. Thus the structure illustrated of the device of the present invention is similar to that of a conventional field controlled thyristor except that the N base of the device of the present invention comprises a two layer N base made up of very lightly doped region 30 near the gate and cathode regions and more heavily doped region 31 near the anode region. This modification of the doping profile exerts a strong influence upon electric field distribution in both the forward and reverse blocking stages of device operation which, in turn, results in significant improvement in forward blocking capability as described, infra. The change in doping profile also results in a significant improvement in forward voltage drop.

Due to the parasitic PNP transistor extant between gate 13 and anode 12 in conventional field controlled thyristors, such as shown in FIG. 1A, breakdown voltage of the field controlled thyristor is limited by open base transistor breakdown. In the conventional device structure therefore, optimum breakdown voltage with the lowest forward voltage drop is achieved by use of an N base 10 width of about one diffusion length longer than the maximum depletion width at avalanche breakdown of the base material. That is, maximum forward blocking voltage is limited by the PNP punch-through breakdown between grid junctions 8 and anode junction 18. This occurs when the depletion layer in N base 10, extending to the dashed line in N base 10 as shown in FIG. 1D, approaches to within approximately one diffusion length of anode junction 18. The grid bias required to achieve blocking is determined by the blocking gain. This blocking gain is a function of N base 10 resistivity as well as the grid 13 spacing and geometry.

In the new device structure, shown in FIG. 2A, the transistor punch-through breakdown is prevented by incorporating into the N base a more heavily doped region 31 near the anode. This allows use of a very low doping level for the remainder 30 of the N base without encountering the open base transistor breakdown effect.

Figure 2D:
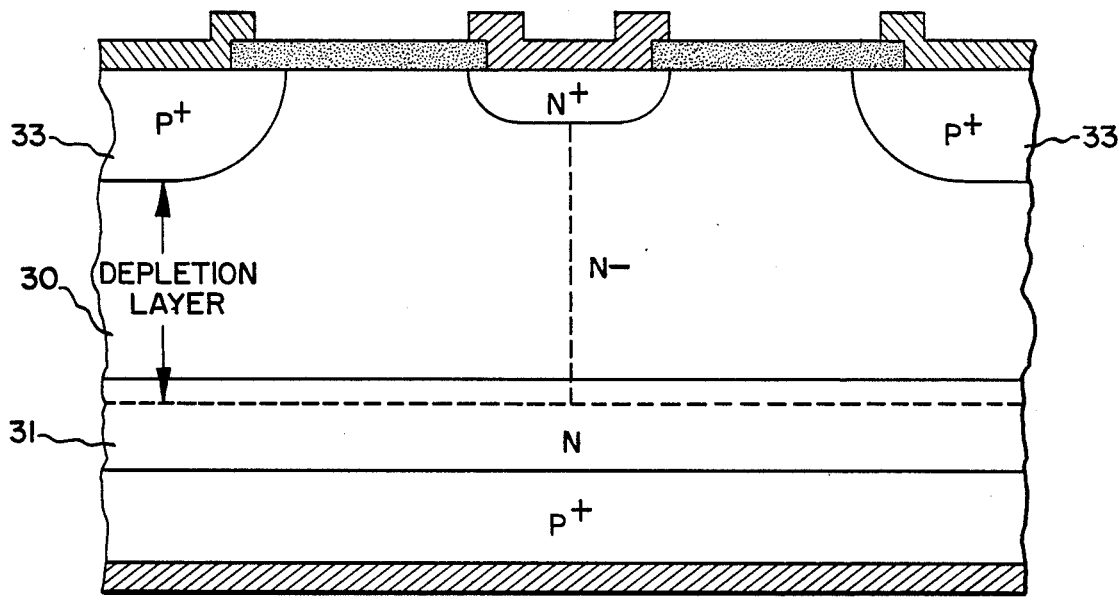
FIG. 2D illustrates the location of the depletion layer in the device of FIG. 2A.

When junctions 41 of the device shown in FIG. 2A are reverse-biased during the forward blocking mode of operation, the gate depletion layer, extending to the dashed line in N base layer 31 as shown in FIG. 2D, contains a low ionized impurity density which results in maintaining a high electric field throughout the depth of lightly doped N-base portion 30, as shown in FIG. 2C. The electric field then decreases very sharply in the more heavily doped N base region 31, thus preventing punch-through breakdown. In contrast, the uniform doping of N base 10 in the conventional device structure shown in FIG. 1A produces a steadily decreasing electric field in N base 10 with its peak at gate junction 8, as shown in FIG. 1C. Because the voltage supported between the gate and anode terminals is given by the area under the electric field profile, it is evident from FIGS. 1C and 2C that, during forward blocking conditions, the structure of FIG. 2A exhibits a substantially higher breakdown voltage for the same total wafer thickness and junction diffusion depths than the structure of FIG. 1A. There is, however, no substantial difference in forward voltage drop during current conduction since the two devices are alike in wafer thickness and in junction depths of anode and cathode regions. Thus the N base doping profile for the device of FIG. 2A results in a higher forward blocking capability than that of the device in FIG. 1A, while maintaining the same forward voltage drop during current conduction.

As an example of the improvement in breakdown voltage provided by the device of FIG. 2A over the device of FIG. 1A, if a 1,000 volt conventional device design is considered, N base resistivity is substantially 35 ohm-cm. At avalanche breakdown, this N base material has a depletion width of substantially 90 micrometers. Since a diffusion length of at least 40 micrometers is required to maintain a low forward voltage drop, the total N base width of the conventional device would be about 130 micrometers. In the new device structure, however, thickness of more heavily doped N base portion 31 is about 30 micrometers to prevent gate depletion layer punch-through to anode region 32. Consequently, for the same wafer thickness, the lightly doped N-base portion 30 of the new device structure would have a thickness of about 100 micrometers. The low doping level of this region results in a uniform electric field, as shown in FIG. 2C, which has a value $E_p$ of about $2 \times 10^5$ V/cm at breakdown as pointed out in S.M. Sze and G. Gibbons, "Avalanche Breakdown Voltages of Abrupt and Linearly Graded p-n Junctions in Ge, Si, GaAs, and GaP", *Applied Physics Letters*, Vol. 8, pp 111-113 (1976). As a result, forward blocking capability of the device of FIG. 1A extends to about 2,000 volts. Thus, a twofold increase in blocking voltage can be expected while maintaining the same forward voltage drop.

Use of lightly doped N-base portion 30 in the gate area of the device of FIG. 2A results in a very large increase in blocking gain over devices of the type shown in FIG. 1A. Since the doping level of the entire N base is lower in region 30, the depletion layers from gate regions 33 extend into the channel area at lower gate voltages than from gate regions 13 in the device shown in FIG. 1A. As a result, the anode-cathode current is pinched off at a lower gate voltage than in the device shown in FIG. 1A, thus providing increased blocking gain. Moreover, if channel width is small and N- base portion 30 is very lightly doped, the diffusion potential of gate junctions 41 can be sufficient to cause gate depletion layer punch-through under the channel. Under these conditions, anode-cathode current flow terminates with zero bias on the gate. However, the potential barrier in the channel at zero gate bias is small and can therefore prevent anode-cathode current flow only at anode voltages below 100 volts. Further, due to this depletion layer punch-through at low gate voltages, high blocking gains can be obtained by use of the planar diffusion process, eliminating need for use of the more complex epitaxial-refill technology that has heretofore been required to achieve high blocking gains. Device processing yields may consequently be expected to improve.

Another significant advantage of the structure shown in FIG. 2A is improved gate turn-off capability. In the conventional device structure shown in FIG. 1A, gate turn-off is achieved at gate voltages which create a depletion layer that pinches off the anode-cathode current, but with the depletion layer extending only a short distance from the gate junction as shown in FIG. 1D. As a result, the gate depletion layer sweeps out only a small fraction of the charge which is injected into N base 10 during forward conduction. The remaining charge in N base 10 must then decay by recombination. This causes the anode-cathode current to gradually tail off, decreasing switching speed of the device. In contrast, the very low doping level of upper N- base layer 30 in the asymmetrical field controlled thyristor shown in FIG. 2A results in the gate depletion layer extending entirely through N- base layer 30, as shown in FIG. 2D, even at low gate voltages. As a result, most of the charge injected into the N base during forward conduction is swept out when gate 33 is reverse-biased. This leaves only a small fraction of the charge to decay by recombination, thus improving switching speed of the devices.

Fabrication of the asymmetrical field controlled thyristor of the present invention begins with high resistivity, N type silicon wafers, such as wafer 30, shown in FIG. 3A. A typical resistivity is 2,000 ohm-cm, although resistivity above 50 ohm-cm is suitable, depending upon the breakdown voltage desired for the device. The higher resistivities should be selected for devices requiring higher breakdown voltages and high blocking gains.

Wafer 30 is first oxidized, preferably in a steam-oxygen mixture at 1150° C., to obtain a silicon oxide layer of 10,000 angstroms on the surface. This oxide layer is then removed on the lowermost or back surface 40 of the wafer, which is to serve as the anode region of the device being fabricated, leaving oxide layer 39 on the upper surface.

A phosphorous diffusion is performed on back surface 40 of the wafer to obtain a diffused layer 31 with a surface concentration of about $2 \times 10^{17}$ dopant atoms per cc and a depth of 30-50 micrometers. Typical phosphorous deposition may be performed at 800° C. for 30 minutes using phosphorous oxychloride, followed by a drive-in cycle at 1250° C. for 50 hours, resulting in the structure shown in FIG. 3B.

Oxide layer 39 on the uppermost or front surface of the wafer is next patterned using conventional photolithography to open the gate diffusion area, and oxide on back surface 40 of the wafer is also removed at this time. A boron diffusion is then performed on both sides of the wafer, so as to diffuse boron therein through both major surfaces of the wafer. Typical diffusion may be performed at 975° C. for one hour using boron nitride source wafers, followed by a drive-in cycle at 1250° C. for two hours. This diffusion simultaneously creates anode region 32 and gate regions 33, with a surface concentration of about $1 \times 10^{19}$ cm$^{-3}$ and a junction depth of about 5 micrometers, as shown in FIG. 3C. However, separate boron diffusions may alternatively be performed to fabricate these regions if desired.

Oxide layer 39 on the front surface of the wafer is next patterned by conventional photolithography to open the cathode diffusion area. The oxide layer 44 formed on the back surface of the wafer is not removed during this step. A phosphorous diffusion is then performed to create the source or cathode region 34. Diffusion is typically performed with a deposition at 900° C. for 30 minutes followed by a drive-in cycle at 1000° C. for 30 minutes to obtain a junction depth of 1.5 micrometers and a surface concentration of $1 \times 10^{19}$ cm$^{-3}$ resulting in the structure shown in FIG. 3D.

Oxide layer 39 is again photolithographically patterned to open contact windows for the cathode and gate, while the oxide layer on back surface 40 is removed to open a contact area for the anode. Aluminum is then evaporated on the front surface to a thickness of 1-2 micrometers, and patterned photolithographically to obtain contacts 35 and 36 to the gate and cathode areas, respectively, as shown in FIG. 3E. An aluminum layer 37 is next evaporated on the anode side of the wafer, and sintered at 400° C. for 30 minutes to lower contact resistance, resulting in the structure illustrated in FIG. 3F.

A typical device formed according to the aforementioned processing steps may be fabricated with a plurality of cathode fingers, each cathode finger having a width of 10 micrometers and a length of 750 micrometers. The cathode fingers are interdigitated with, and surrounded by, the gate region. Breakdown voltage of these devices has been found to increase with wafer thickness (or depth), and ranges from 500 volts for wafers of 5 mil thickness to 1000 volts for wafers of 10 mil thickness. Moreover, for wafers of 10 mil thickness, the fabricated device can block an anode voltage of over 950 volts with an applied gate bias of but 14 volts, so that DC blocking gain exceeds 65.

Blocking gain of the asymmetrical field controlled thyristors fabricated in accordance with the present invention has been found to be a function of N base thickness, even with gate junction depth held unchanged; that is, maximum anode blocking voltage increases with N base width. This is to be expected since the high electric field is maintained over a wider N base as wafer thickness increases. In addition, blocking gain has also been found to be dependent upon N base width, and increases by more than a factor of 3 in going from a base width of 65 micrometers to a base width of 190 micrometers. This dependence of the blocking gain on the N base width arises from the very low N base doping level, which results in the gate depletion layer extending across the entire N base of these devices for all wafer thicknesses, under forward blocking conditions. The pinch-off region in the channel, therefore, extends all the way from cathode 34 to N type diffused buffer layer 31.

As previously noted, the device of FIG. 2A is designed to allow the gate depletion layer to punch through in the channel region without any applied gate bias. This gives the device ability to block anode current even without an applied reverse gate bias. However, the potential barrier created in the channel by the inherent potential of gate junction 41 is sufficient to block current flow only at low anode voltages; that is, as anode voltage is increased, the device switches from the blocking state to the conductive state.

When the device of FIG. 2A is operating in the conductive state, its characteristics resemble those of a rectifier diode. At low anode currents, the device current increases exponentially with anode voltage and the device exhibits a low forward voltage drop due to conductivity modulation of the dual-layer N base by the injected holes and electrons from the anode and cathode regions, respectively. This conductivity modulation decreases as N base width is increased, and results in an increase in forward voltage drop with increasing base width. While the effect of increasing the base width on forward voltage drop is small at low current densities, it becomes quite severe at higher current densities. At a device current of 10 amperes, cathode current density exceeds 1000 A/cm$^2$. At these current densities, diffusion length of the carriers in the N base region is decreased, reducing the conductivity modulation more severely in the wider N base devices to produce the aforementioned increase in forward voltage drop. However, a conventional field controlled thyristor with the same forward blocking capability would require a wider N base and would, therefore, exhibit a considerably higher forward voltage drop than the device shown in FIG. 2A.

The foregoing describes a field controlled thyristor with gate turn-off capability and high blocking gain. The device exhibits a low forward voltage drop and a high speed switching capability. The power field controlled thyristor of the invention readily lends itself to fabrication by conventional planar semiconductor diffusion technology.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. An asymmetrical field controlled thyristor comprising:
   a semiconductor substrate of one type conductivity;
   a dual-layer base region adjoining said substrate and being comprised of an integral portion of said semiconductor material with opposite type conductivity and consisting of first and second layers, the first layer of said dual-layer base region being closest to said substrate and being doped at a higher concentration of opposite conductivity type determining dopants than the second layer of said dual-layer base region being farthest from said substrate;
   a cathode region adjoining only said second layer of said dual-layer base region, said cathode region being doped at a higher concentration of said opposite conductivity type-determining dopants than the layer of said dual-layer base region closest to said substrate;
   a plurality of semiconductor gate regions spaced apart from said cathode region on either side thereof, said gate regions adjoining only said second layer of said dual-layer base region;
   first conductive means contacting the outermost surface of said cathode region;
   second conductive means contacting the outermost surface of said gate regions; and
   third conductive means contacting the outermost surface of said anode region.

2. The apparatus of claim 1 wherein said semiconductor material of said one type conductivity comprises a P type semiconductor and said material of said opposite type conductivity comprises an N type semiconductor.

3. The apparatus of claim 1 wherein said semiconductor material comprises silicon.

4. The apparatus of claim 2 wherein said semiconductor material comprises silicon.

5. The apparatus of claim 1 wherein each of said conductive means comprises a respective layer of aluminum.

6. The apparatus of claim 2 wherein each of said conductive means comprises a respective layer of aluminum.

7. The apparatus of claim 4 wherein each of said conductive means comprises a respective layer of aluminum.

8. The asymmetrical field controlled thyristor of claim 1, wherein said first layer has a surface concentration of $2 \times 10^{17}$ dopant atoms per cc.

9. An asymmetrical field controlled thyristor comprising:
   a semiconductor body including successive anode, base and cathode regions;
   said base region consisting of a dual-layer base exhibiting a doping gradient, a heavier doping concentration being adjacent to said anode region and a lighter doping concentration being adjacent to said cathode region; and
   a plurality of semiconductor gate regions spaced apart from said cathode regions on either side thereof and being adjacent said base region exhibiting said lighter doping concentration whereby said device exhibits a low forward voltage drop and improved turn-off time.

10. A field controlled semiconductor device comprising:
    an anode region of one type conductivity, forming a first surface of said field controlled semiconductor device;
    a body of opposite type conductivity material, adjoining said anode region and consisting of a first layer adjoining said anode region and a lightly doped second layer atop said first layer and forming a first portion of a second surface of said field controlled semiconductor device, the doping concentration of said first layer being greater than the doping concentration of said second layer;
    a heavily doped cathode region of opposite type conductivity disposed within said lightly doped second layer;
    a gate region of one type conductivity disposed in and forming a PN junction with said lightly doped second layer; and
    means for controllably coupling said gate electrode to a supply of bias potential for reverse biasing said PN junction and establishing a depletion region which pinches off the current flow between said anode and said cathode wherein said lightly doped second layer facilitates establishment of said depletion region at lower gate potentials.

11. The field controlled semiconductor device of claim 10 wherein said second layer comprises a substantial portion of said body and said gate region, in response to an appropriately applied reverse bias potential, provides a depletion region which extends entirely throughout said second layer whereby most of the charge injected into the second layer during forward conduction is swept out to thereby improve the switching speed of the device.

12. The field controlled semiconductor device of claim 10 wherein said gate region is annular in configuration and laterally surrounds said cathode region.

13. The field controlled semiconductor device of claim 12 wherein said gate region uniformly surrounds said cathode region.

14. The field controlled semiconductor device of claim 10 wherein said gate region extends to a depth greater than the depth of said cathode region.

15. The field controlled semiconductor device of claim 10 wherein said cathode is finger-like in configuration having a width of approximately 10 micrometers, a length of approximately 750 micrometers and a depth of approximately 1.5 micrometers and is surrounded by said gate region.

16. The field controlled semiconductor device of claim 10 wherein said cathode region and said gate region form second and third portions of said second surface of said field controlled semiconductor device.

17. The field controlled semiconductor device of claim 10 wherein said first layer has a doping concentration in excess of $2 \times 10^{17}$ dopant atoms per cubic centimeter.

18. A three terminal FCT (field controlled thyristor) comprising
    (a) semiconductor substrate having a pair of opposite main surfaces, said substrate comprising
       (1) a first emitter region having a first conductivity type and exposed in one of said main surfaces of said substrate,
       (2) a second emitter region having a second conductivity type and exposed in other main surface of said substrate, (3) a gate region having said second conductivity type, with a portion of said gate region exposed in said one main surface, (4) a first base region having said first conductivity type and adjacent to said second emitter region, (5) a second base region having said first conductivity type and a lower concentration of the impurity determining said first conductivity type than that of said first base region and adjacent to said first base region, and (b) an electrode formed on said other surface of said substrate and electrodes connected respectively with the exposed portions of said first emitter region and said gate region, wherein the current path between the electrodes connected with said first and second emitter region is blocked by the depletion region formed in said substrate by the voltage applied between the electrodes connected respectively with said first emitter region and said gate region.

19. A three-terminal FCT (field controlled thyristor) comprising (a) semiconductor substrate having a pair of opposite main surfaces, said substrate comprising (1) a first emitter region having a first conductivity type and exposed in one of said main surfaces of said substrate, (2) a second emitter region having a second conductivity type and exposed in other main surface of said substrate, (3) a gate region having said second conductivity type, with a portion of said gate region exposed in said one main surface, (4) a first base region having said first conductivity type and adjacent to said second emitter region, (5) a second base region having said first conductivity type and a lower concentration of the impurity determining said first conductivity type than that of said first base region and adjacent to said first base region, and (b) said other surface of said substrate being adapted to receive an electrode thereon and the exposed portions of said first emitter region and said gate region each being adapted to receive an electrode thereon, respectively, wherein the current path between said first and second emitter region is blocked by the depletion region formed in said substrate by the voltage applied between said first emitter region and said gate region.

20. A field controlled semiconductor device comprising:

an anode region of one type conductivity, forming a first surface of said field controlled semiconductor device;

a body of opposite type conductivity material adjoining said anode region and comprising a first layer adjoining said anode region and a lightly doped second layer atop said first layer and forming a first portion of a second surface of said field controlled semiconductor device, the doping concentration of said first layer being greater than the doping concentration of said second layer;

a heavily doped cathode region of said opposite type conductivity disposed within said lightly doped second layer;

a gate region of said one type conductivity extending from said second surface into said body of opposite conductivity material and forming a PN junction with said lightly doped second layer at its entire interface with said body of opposite type conductivity material; and means for controllably coupling said gate region to a supply of bias potential for reverse biasing said PN junction and establishing a depletion region which pinches off the current flow between said anode and said cathode wherein said lightly doped second layer facilitates establishment of said depletion region at lower gate potentials.

* * * * *